(12) United States Patent
Murphy

(10) Patent No.: US 8,119,926 B2
(45) Date of Patent: Feb. 21, 2012

(54) TERMINAL ASSEMBLY WITH REGIONS OF DIFFERING SOLDERABILITY

(75) Inventor: James V. Murphy, North Kingston, RI (US)

(73) Assignee: Advanced Interconnections Corp., West Warwick, RI (US)

( * ) Notice: Subject to any disclaimer, the term of this patent is extended or adjusted under 35 U.S.C. 154(b) by 324 days.

(21) Appl. No.: 12/416,689

(22) Filed: Apr. 1, 2009

(65) Prior Publication Data

US 2010/0252311 A1 Oct. 7, 2010

(51) Int. Cl.
*H05K 1/16* (2006.01)
(52) U.S. Cl. ......................... 174/260; 439/887
(58) Field of Classification Search ............ 174/262
See application file for complete search history.

(56) References Cited

U.S. PATENT DOCUMENTS

| | | | |
|---|---|---|---|
| 3,562,467 A * | 2/1971 | Mooradian | 200/268 |
| 3,656,092 A * | 4/1972 | Swengel et al. | 439/730 |
| 4,830,264 A | 5/1989 | Bitaillou | |
| 5,051,097 A | 9/1991 | Miles | |
| 5,060,844 A | 10/1991 | Behun | |
| 5,196,726 A | 3/1993 | Nishiguchi | |
| 5,275,330 A | 1/1994 | Isaacs | |
| 5,446,247 A * | 8/1995 | Cergel et al. | 174/267 |
| 5,518,410 A * | 5/1996 | Masami | 439/71 |
| 5,702,255 A * | 12/1997 | Murphy et al. | 439/71 |
| 5,730,606 A * | 3/1998 | Sinclair | 439/70 |
| 5,746,608 A * | 5/1998 | Taylor | 439/70 |
| 5,873,740 A * | 2/1999 | Alcoe et al. | 439/67 |
| RE36,442 E | 12/1999 | Kardos | |
| 6,007,348 A | 12/1999 | Murphy | |
| 6,011,224 A * | 1/2000 | Zdanys, Jr. | 200/16 D |
| 6,018,197 A * | 1/2000 | Saiki et al. | 257/784 |
| 6,029,882 A * | 2/2000 | Bolde et al. | 228/254 |
| 6,299,058 B1 * | 10/2001 | Lau et al. | 228/248.1 |
| 6,313,999 B1 | 11/2001 | Fratti | |
| 6,325,280 B1 * | 12/2001 | Murphy | 228/246 |
| 6,337,445 B1 | 1/2002 | Abbott | |
| 6,347,946 B1 * | 2/2002 | Trobough et al. | 439/70 |
| 6,433,425 B1 | 8/2002 | Sarkhel | |
| 6,465,747 B2 | 10/2002 | DiStefano | |
| 6,475,833 B2 | 11/2002 | Lin | |
| 6,617,688 B2 | 9/2003 | Ikegami | |
| 6,623,284 B1 * | 9/2003 | Korsunsky | 439/83 |
| 6,750,551 B1 * | 6/2004 | Frutschy et al. | 257/785 |

(Continued)

FOREIGN PATENT DOCUMENTS

FR 2473216 A * 7/1981

(Continued)

*Primary Examiner* — Timothy Thompson
*Assistant Examiner* — Nathan Milakovich
(74) *Attorney, Agent, or Firm* — Occhiuti Rohlicek & Tsao LLP

(57) ABSTRACT

An intercoupling component is provided which permits reliable, non-permanent electrical connection between a first substrate and a second substrate. The intercoupling component includes an electrically conductive terminal including a first end and a second end opposed to the first end. The first and second ends are configured to receive a solder ball. An axial hole extends inward from the first end of the terminal, and an electrically conductive core member is disposed within the hole. The core member is sized and shaped to obstruct the hole. In addition, at least an outer surface of the core member includes a first material and at least an outer surface of the body includes a second material, the first material having greater solderability than the second material.

16 Claims, 9 Drawing Sheets

U.S. PATENT DOCUMENTS

| | | | |
|---|---|---|---|
| 6,828,512 B2 | 12/2004 | Chung | |
| 6,974,339 B2 * | 12/2005 | Kuzmenka | 439/161 |
| 7,094,069 B1 | 8/2006 | Saydam | |
| 7,129,113 B1 | 10/2006 | Lin | |
| 7,268,430 B2 | 9/2007 | Suga | |
| 7,393,214 B2 | 7/2008 | DiStefano | |
| 7,537,461 B2 * | 5/2009 | Rathburn | 439/66 |
| 2006/0052011 A1 * | 3/2006 | Goodman et al. | 439/700 |
| 2006/0278966 A1 * | 12/2006 | Trezza et al. | 257/685 |
| 2007/0125571 A1 | 6/2007 | Casasnovas | |
| 2007/0202731 A1 * | 8/2007 | Goodman et al. | 439/284 |
| 2008/0032524 A1 * | 2/2008 | Lemke et al. | 439/78 |
| 2008/0182436 A1 * | 7/2008 | Rathburn | 439/78 |
| 2008/0237857 A1 * | 10/2008 | Low et al. | 257/741 |
| 2009/0065918 A1 * | 3/2009 | Murphy | 257/686 |
| 2009/0233436 A1 * | 9/2009 | Kim et al. | 438/614 |
| 2009/0256255 A1 * | 10/2009 | Gektin et al. | 257/738 |

FOREIGN PATENT DOCUMENTS

| | | | |
|---|---|---|---|
| JP | 06177134 A | * | 6/1994 |
| JP | 10221367 A | * | 8/1998 |
| JP | 2000315555 A | * | 11/2000 |

* cited by examiner

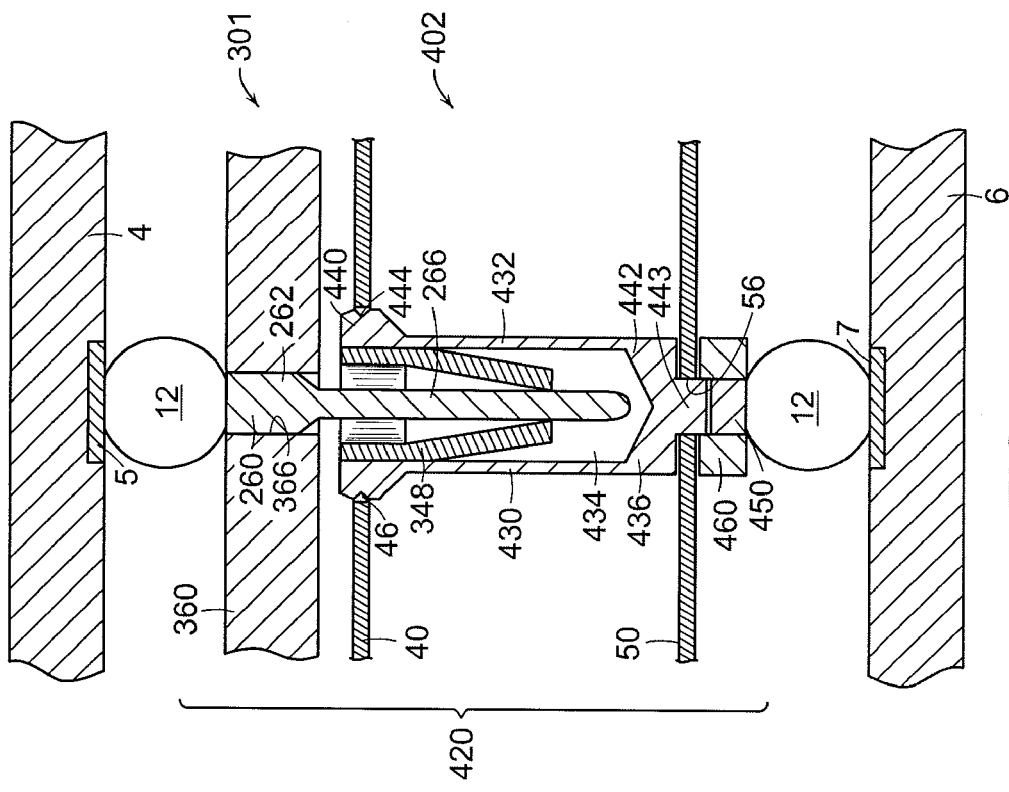
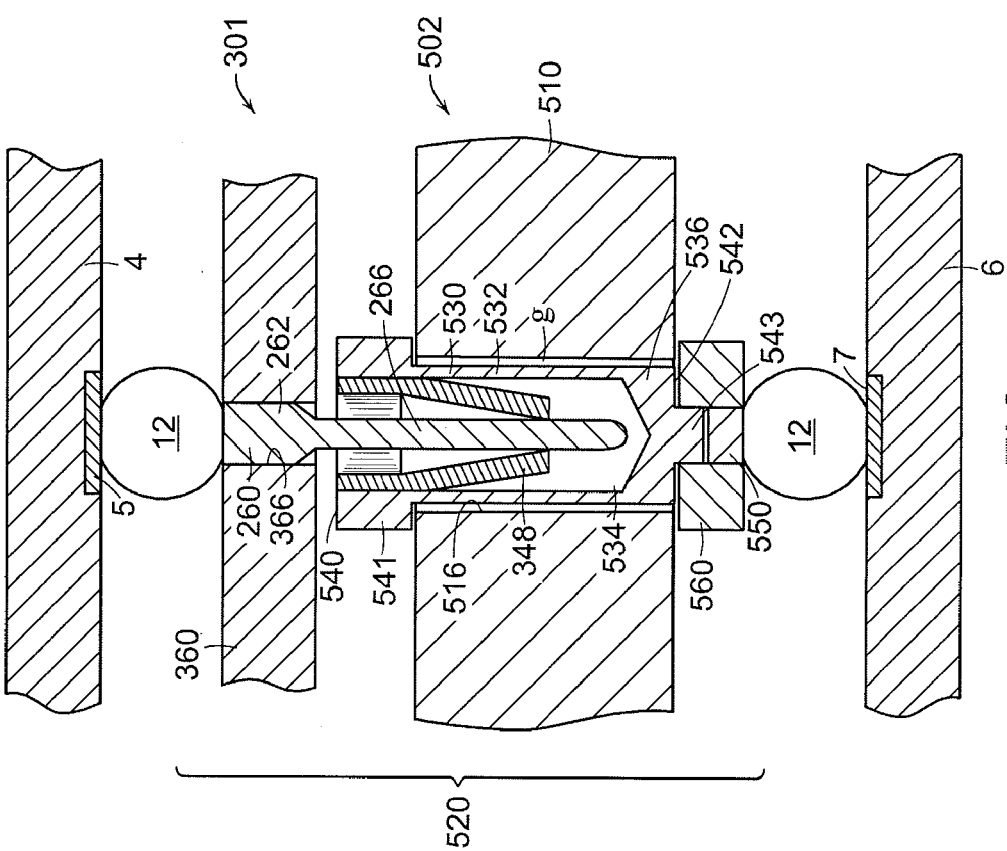
FIG. 7
FIG. 8

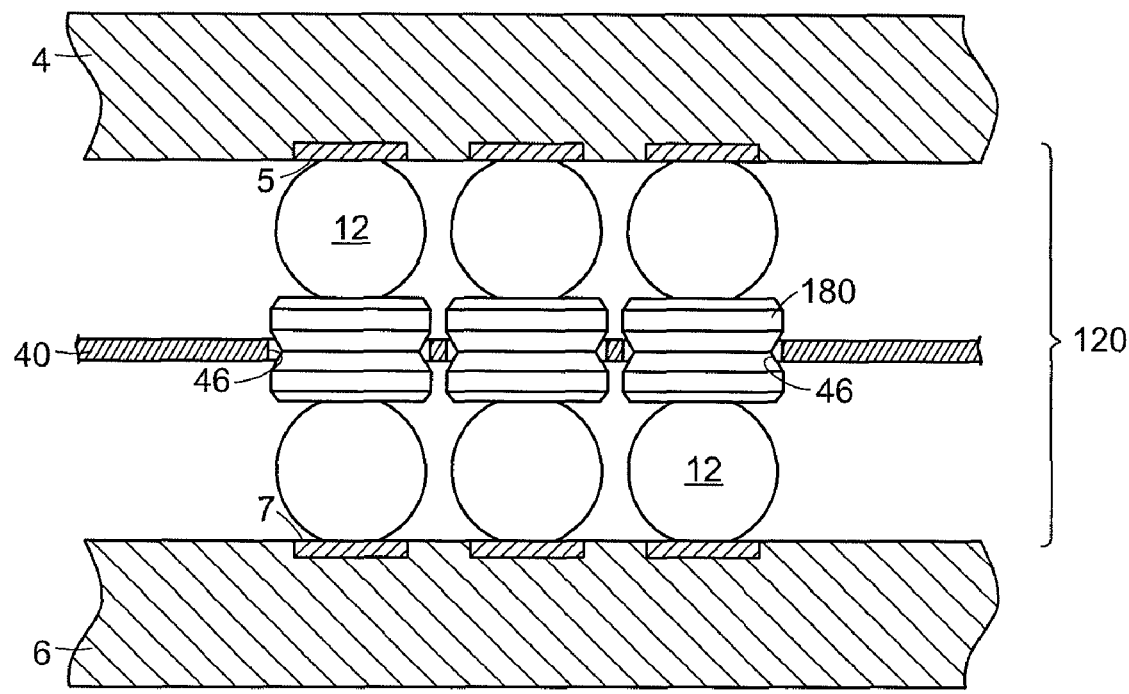
FIG. 14
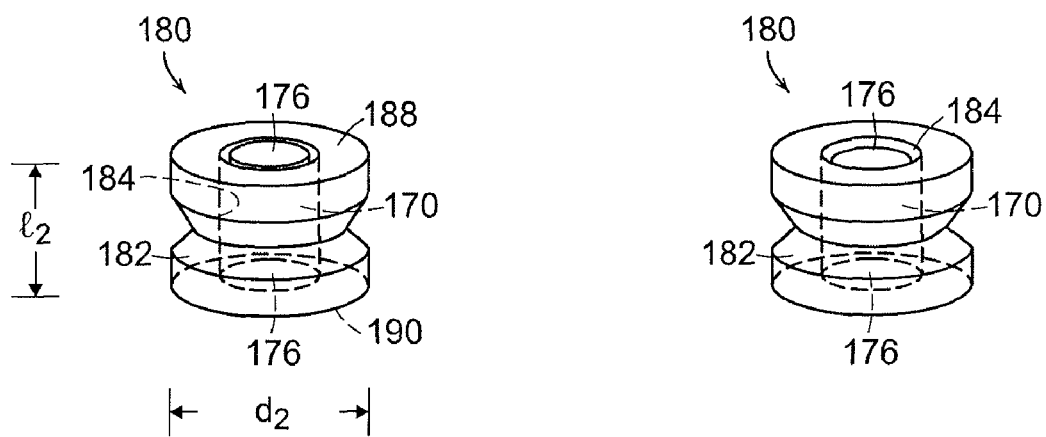
FIG. 15
FIG. 16

TERMINAL ASSEMBLY WITH REGIONS OF DIFFERING SOLDERABILITY

BACKGROUND OF THE INVENTION

This invention relates to making electrical connections between electrical contacts of a first substrate and electrical contacts of a second substrate.

Ball grid array (BGA) and land grid array (LGA) integrated circuit (IC) packages are becoming increasingly popular. With a BGA package, for example, the rounded solder balls of the BGA are generally soldered directly to corresponding surface mount pads of a printed circuit board rather than to plated thru-holes which receive pins from, for example, a pin grid array (PGA) package. BGA packages are advantageous due to the ability to provide a high density of connections and low profiles. In addition, BGAs, with their very short distance between the package and the printed circuit board, have low inductances and therefore have far superior electrical performance relative to leaded devices. Once soldered to a printed circuit board, however, BGAs are difficult to replace or interchange.

Intercoupling components are used to allow particular IC packages to be reliably interchanged without permanent connection to a printed circuit board. More recently, adaptors for use with BGA and LGA packages have been developed to allow these packages to be non-permanently connected (e.g., for testing) to a printed circuit board.

SUMMARY

This invention relates to an intercoupling component to permit reliable, non-permanent electrical connection between a first substrate and a second substrate. More particularly, the intercoupling component includes an electrically conductive terminal assembly including a first end and a second end opposed to the first end. The first and second ends of the terminal assembly are configured to receive, and form an electrical connection with, a solder ball. An axial hole extends inward from each of the first end and the second end of the terminal, and an electrically conductive core member is disposed within each hole. The core members are sized and shaped to obstruct the hole. In addition, at least an outer surface of the core members includes a first material and at least an outer surface of the body includes a second material, the first material having greater solderability than the second material.

In one aspect, an electrical terminal is provided that includes an electrically conductive terminal body. The terminal body includes a first end and an axial hole extending inward from the first end. The first end is configured to receive a first solder ball. The terminal body includes a second end opposed to the first end, and the second end is configured to receive a second solder ball. The electrical terminal further includes an electrically conductive core member disposed within the hole. The core member is sized and shaped to obstruct the hole. In addition, at least an outer surface of the core member includes a first material and at least an outer surface of the body includes a second material, and the first material has greater solderability than the second material.

The electrical terminal includes one or more of the following features:

The first material is one of gold, gold alloy, tin, tin-lead alloy, and palladium-nickel alloy. The second material is one of nickel and nickel alloy. The core member is fixed within the through hole. The core member includes a shank portion received within the axial hole, and a head portion connected to the shank portion. The head portion is disposed outside the axial hole and includes a side which faces toward the first end. The core member is an elongate cylindrical member having a first end and a second end, and the first end is provided with a first diameter, and the second end is provided with a second diameter. The second diameter is greater than the first diameter, and the first end is fitted within the axial hole.

In some aspects, an intercoupling component of the type used to electrically connect a first substrate with a second substrate is provided. The intercoupling component includes an insulating support member having an array of apertures. Each aperture extends from a first surface of the insulating support member to an opposite second surface of the insulating support member, and each aperture is configured to receive a terminal assembly. The intercoupling component also includes a plurality of terminal assemblies which provide electrical connections between connection regions of the first substrate and respective corresponding connection regions of the second substrate. A terminal assembly is disposed in at least some of the apertures. Each terminal assembly includes an electrically conductive terminal body. The terminal body includes a first end and an axial hole extending inward from the first end. The first end is configured to receive a first solder ball. The terminal body also includes a second end opposed to the first end, and the second end is configured to receive a second solder ball. Each terminal assembly also includes an electrically conductive core member disposed within the hole. The core member is sized and shaped to obstruct the hole. At least an outer surface of the core member includes a first material and at least an outer surface of the body includes a second material, and the first material has greater solderability than the second material.

The intercoupling component may include one or more of the following features:

The first material is one of gold, gold alloy, tin, tin-lead alloy, and palladium-nickel alloy. The second material is one of nickel and nickel alloy. The core member is fixed within the through hole. The insulative support member includes a thin polyamide sheet. The core member is positioned within the axial hole such that an end face of the core member is flush with respect to the first end of the body. The core member includes a shank portion received within the axial hole, and a head portion connected to the shank portion. The head portion is disposed outside the axial hole and includes a side which faces toward the first end.

In some aspects, a method of forming an electrical terminal is provided. The method includes the following method steps: Forming a body using a screw machining process, the body including a first end and an axial hole extending inward from the first end. Forming a core member using a screw machining process separately from the body, the core member sized to fit within and obstruct the axial hole. Assembling the core member within the axial hole so that the hole is obstructed by the core member. In the method, at least an outer surface of the core member includes a first material and at least an outer surface of the body includes a second material, and the first material has greater solderability than the second material.

The method may further include plating at least the outer surface of the core member with the first material, and plating at least the outer surface of the body with the second material.

In some aspects, a method of connecting a ball grid array of a first substrate, the ball grid array including solder balls of a first type, to electrical connections on a second substrate using an intercoupling device including solder balls of a second type, is provided. The method steps include: Providing the device including a plurality of individual electrical terminals supported on an insulative sheet member. Arranging the first substrate on an upward facing surface of the device such that each solder ball of the ball grid array contacts a corresponding terminal of the device. Heating the device and first substrate in an environment having a temperature within a first range of temperatures to form an electrical connection between each solder ball of the ball grid array and the corresponding terminal. Inverting the device so that the first substrate resides below the device. Providing a solder ball of the second type on an upward facing surface of one or more of the terminals. Heating the device, first substrate, and solder balls of the second type in an environment having a temperature within a second range of temperatures. The second range of temperatures is lower than the first range of temperatures, so as to form an electrical connection between each solder ball of the second type and the corresponding terminal. Inverting the device so that the first substrate resides above the device. Arranging the device on an upper surface of the second substrate such that each solder ball of the second type contacts an electrical contact element of the second substrate. Heating the device, first substrate, and second substrate in an environment having a temperature within the second range of temperatures so as to form an electrical connection between each solder ball of the second type and the corresponding electrical contact elements of the second substrate.

The method may include one or more of the following features:

The solder balls of the first type are lead-free, and the solder balls of the second type are a tin-lead alloy. The second range of temperatures includes a range of temperatures at which the lead-free solder balls of the ball grid array do not reflow.

In some aspects, an electrical intercoupling device is provided. The device includes an electrically insulative support member including an array of through holes. The through holes extend between opposed first and second surfaces of the insulative support member. The distance between the first and second surfaces define a thickness of the support member. The device further includes plural electrically conductive terminals. Each terminal is disposed in a through hole and includes a terminal head, a terminal body extending from the terminal head and a retaining member that is separable from the terminal body. The terminal body includes a length that is greater than the thickness of the insulative support member, and a cross section that is configured such that an outer surface of the terminal body is spaced apart from an inner surface of the corresponding through hole. The terminal head has a dimension that is larger than the hole dimension. In addition, each terminal is disposed in a corresponding through hole of the array of through holes such that the terminal body resides in the hole and the retaining member is disposed on an end of the terminal body and is configured to cooperate with the terminal head to maintain the terminal within the hole.

The device may include one or more of the following features:

At least an outer surface of the retaining member includes a first material and at least an outer surface of the terminal body includes a second material. At least an outer surface of the terminal body includes a solderable material and at least an outer surface of the retaining member includes a material that is resistive to solder flow. At least an outer surface of the retaining member includes nickel. The retaining member is annular in shape, has an inner diameter of substantially the same dimension as the terminal body, and has an outer dimension that is larger than the hole dimension. The terminal head is positioned adjacent the first surface of the insulative member, and the retaining member is positioned adjacent the second surface of the insulative member. The terminal body comprises a first end integral with the terminal head, and an opposed second end, the second end of the terminal body including plug formed of a material different than the material of the terminal body. The second end of the terminal body terminates in the plug. The second end of the terminal body has a cross-sectional dimension that is less than that of the first end of the terminal body, and the plug has the same cross-sectional dimension as that of the second end. At least an outer surface of the plug includes a solderable material and at least an outer surface of the retaining member includes a material that is resistive to solder flow.

In some aspects, an electrical intercoupling device is provided. The device includes an electrically insulative support member including an array of through holes. The through holes extend between opposed first and second surfaces of the insulative support member. The distance between the first and second surfaces defines a thickness of the support member. The device also includes plural electrically conductive terminals. Each terminal is disposed in a through hole and includes a terminal head, a terminal body having a first end integral with the terminal head, and an opposed second end. The second end of the terminal body terminates in a plug formed of a material different than the material of the terminal body.

The device may include one or more of the following features:

Each terminal further includes a retaining member, the terminal body includes a length that is greater than the thickness of the insulative support member, and the terminal head has a dimension that is larger than the hole dimension. In addition, each terminal is disposed in a corresponding through hole of the array of through holes such that the terminal body resides in the hole. In addition, the retaining member is disposed on the second end of the terminal body and is configured to cooperate with the terminal head to maintain the terminal within the hole. At least an outer surface of the plug includes a solderable material and at least an outer surface of the retaining member includes a material that is resistive to solder flow. The retaining member is annular in shape, has an inner diameter of substantially the same dimension as the second end of the terminal body, and has an outer dimension that is larger than the through hole dimension.

Because the terminal assemblies disclosed herein are constructed by assembling a core member within a terminal body, manufacturing costs are greater than for terminal assemblies which are of single-piece construction and require no assembly. However, the increased manufacturing costs associated with the assembly of the core member within the terminal body are offset by reductions in material costs. That is, the cost savings associated with plating only the core member with a material such as gold, rather than the entire terminal assembly with a material such as gold, more than compensates for the cost of assembling the core member within the terminal body.

Modes for carrying out the present invention are explained below by reference to an embodiment of the present invention shown in the attached drawings. The above-mentioned object, other objects, characteristics and advantages of the present invention will become apparent from the detailed description of the embodiment of the invention presented below in conjunction with the attached drawings.

BRIEF DESCRIPTION OF THE DRAWINGS

FIG. 7 is a partial side sectional view of another embodiment of an intercoupling component.

FIG. 8 is a partial side sectional view of another embodiment of an intercoupling component.

FIG. 14 is a side view of another embodiment of an intercoupling component.

FIG. 15 is a perspective view of a terminal of the intercoupling component of FIG. 14.

FIG. 16 is a perspective view of another embodiment of a terminal of the intercoupling component of FIG. 14.

DETAILED DESCRIPTION

Figure 1:
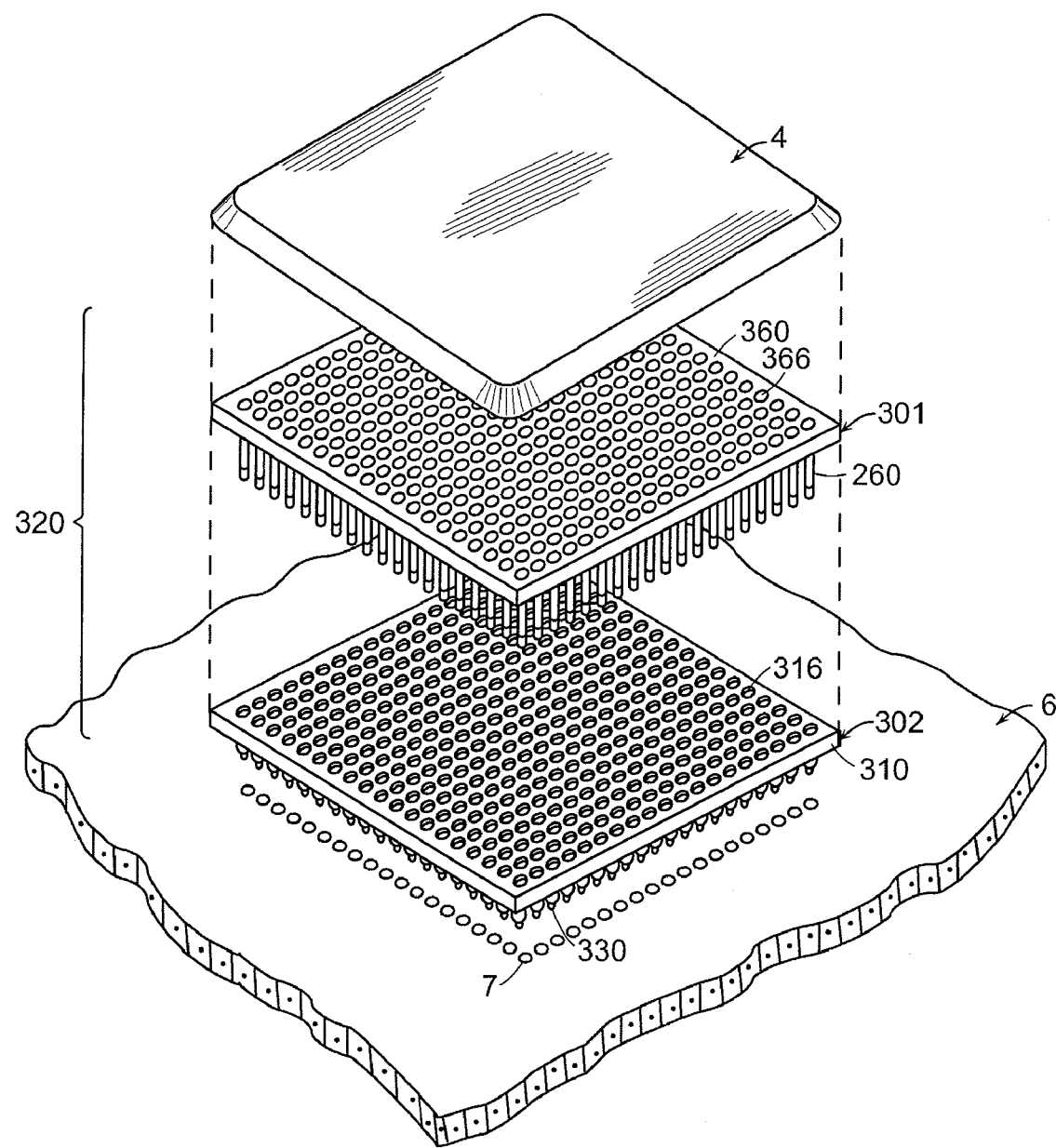
FIG. 1 is an exploded perspective view of an intercoupling component of the type used to couple a printed circuit board to a BGA package.

Referring to FIG. 1, a BGA socket converter assembly 320 for intercoupling a BGA integrated circuit package 4 to a printed circuit board 6 is shown. The BGA socket converter assembly 320, serving as an intercoupling component, includes a socket adaptor 302 and a pin adaptor 301. The socket adaptor 302 includes a first electrically insulative support member 310 for supporting sockets 330, each of which is received within a corresponding one of an array of holes 316 in the first insulative member 310. The array of holes 316 are provided in a pattern corresponding to a footprint of rounded solder balls (not shown) of BGA package 4 as well as a footprint of surface mount pads 7 of printed circuit board 6. The pin adaptor 301 includes a second electrically insulative support member 360 supporting pins 260 positioned within an array of holes 366. Like the array of holes 316 in the first insulative member, the array of holes 366 in the second insulative member 360 is provided in a pattern corresponding to a footprint of the rounded solder balls of the BGA package 4 as well as a footprint of the surface mount pads 7 of the printed circuit board 6.

When the solder balls of the BGA package 4 are soldered to the pins 260 of pin adaptor 301, the BGA package 4 is converted to a high density pin grid array (PGA). When the pin adaptor 301 is assembled with the socket adaptor 302, pins 260 are received within sockets 330. As will be discussed in detail below with respect to FIG. 2, each socket 330 includes a solder ball 12 attached to its lower end 342 to provide an identical mating condition to the surface mount pads 7 of the printed circuit board 6 as would have been the case if the BGA package 4 had been connected directly to the circuit board. Thus, the converter assembly 320 permits the BGA package 4 to be non-permanently electrically intercoupled with the printed circuit board 6.

Figure 2:
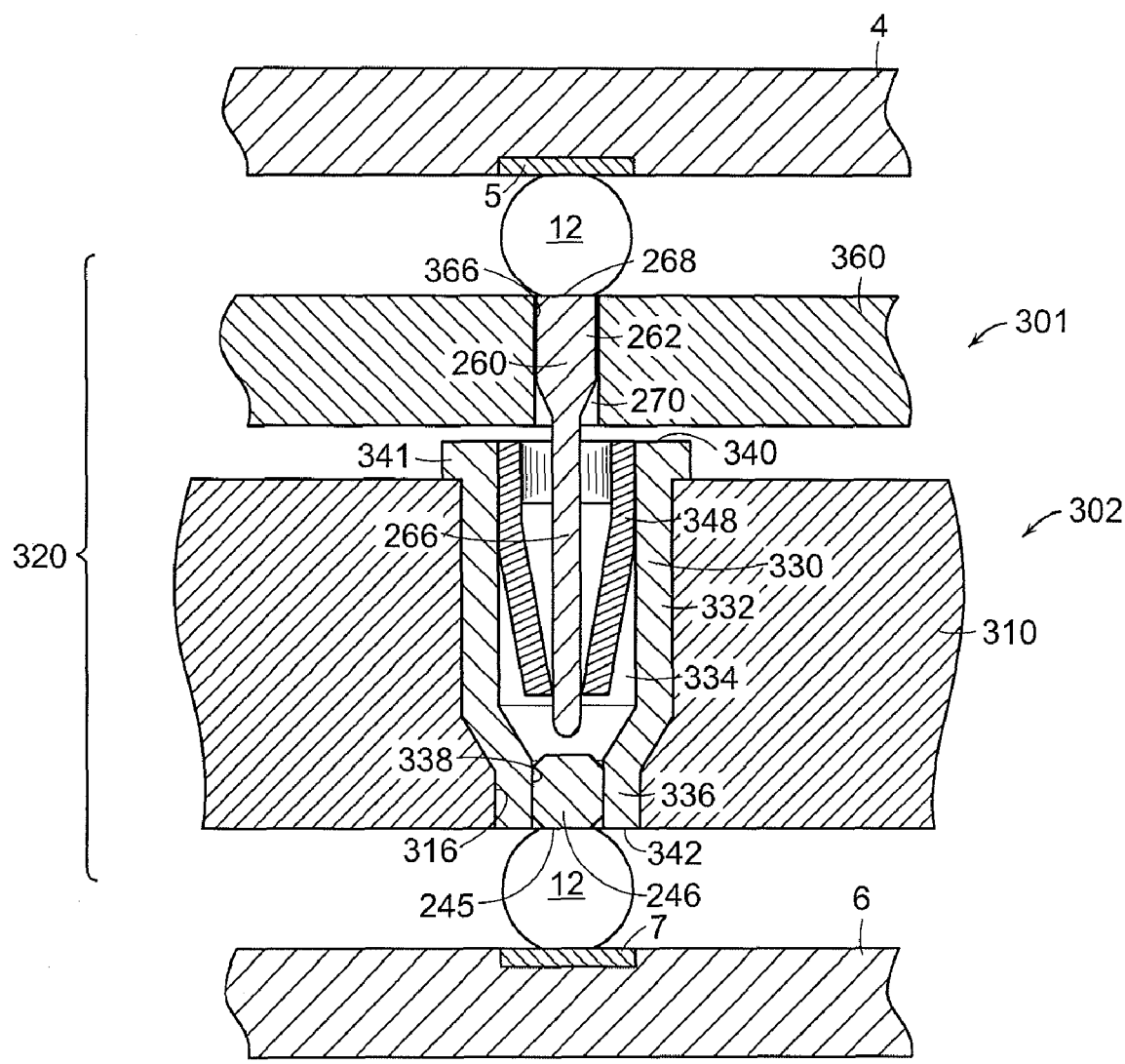
FIG. 2 is a partial side sectional view of the intercoupling component of FIG. 1.

As seen in FIG. 2, each pin 260 cooperatively engages a corresponding socket 330 to provide an electrical connection between a surface mount pad 5 of BGA package 4 and a corresponding surface mount pad 7 of printed circuit board 6.

The pin 260 includes a pin head 262 fixed within the hole 366, and an integral stem 266 that extends outward from the pin head 262. The pin 260 is configured to receive a solder ball 12 at one end of the pin head 262. In the illustrated orientation of the socket converter assembly 320, the solder ball 12 is received on a first, upper end 268 of the pin head 262, and the stem 266 extends from a second, opposed, lower end 270 of the pin head 262.

The socket 330 includes a socket base 336 having an end 342 configured to receive a solder ball 12, and a socket body 332 extending integrally from the socket base 336. The socket body 332 is supported on the electrically insulative support member 310. The socket body 332 includes a socket cavity 334 opening at an end 340 of the socket body 332 opposed to the base end 342, and a resilient contact member 348 is disposed within the cavity 334. The resilient contact member 348 is fixed within cavity 334 and forms an electrical connection with the socket body 332 along mutually contacting surfaces. In use, the stem 266 of the pin 260 is slidably received within, and forms an electrical connection with, the resilient contact member 348.

An axial hole 338 is provided at, and extends axially inward from, the end 342 of the socket base 336. A core member 246 is disposed within the axial hole 338.

The core member 246 is electrically conductive and is sized and shaped to obstruct the axial hole 338, where the term obstruct as used herein refers to a full and complete blocking of, or stopping-up of, the hole, whereby fluid flow between the core members 246 and the inner surface of the axial hole 338 is prevented. The core member 246 is fixed within the axial hole 338 and forms an electrical connection with the socket head 336 along mutually contacting surfaces. The core member 246 is positioned within the axial hole 338 so that an end face 245 of the core member 246 lies flush with the outer surface of the terminal structure. That is, in the socket 330, the core member 246 lies flush with the end 342 of the socket base 336. Alternatively, the core member 246 may be positioned within the axial hole 338 so that an end face 245 of the core member 246 is spaced slightly inward relative to an end face of the terminal structure, forming a shallow depression (not shown) at the location of the core member 246. The depression can be useful in positioning and retaining the solder ball 12 relative to the socket base end 342.

The pin 260, the socket 330 and core members 246 are formed of electrically conductive materials. During solder reflow, solder is prevented from flowing along a peripheral side of the socket 330 by selective use of materials in the manufacture thereof. In particular, the socket 330 is formed of, coated, or plated with a material that is resistive to solder flow or has relatively low solderability. In addition, the core member 246 is formed of, coated, or plated with material that has relatively high solderability in that it promotes solder flow, forms a good electrical contact and bonds well with a solder ball. As a result, when a solder ball 12, positioned adjacent to an end 342 of the socket 330, is heated to cause the solder to flow, the solder does not flow along a peripheral side of the socket 330 due to the chemical response of the solder to the materials of the terminal body. Instead, solder is generally maintained in the vicinity of the core member 246.

In some embodiments, the socket 330 is manufactured entirely of an electrically conductive material that is resistive to solder flow or has relatively low solderability as compared to the material used to manufacture the core members 246. Such materials will be referred to herein as "solder resistive materials." Solder resistive materials generally inhibit solder flow and do not bond well with the applied solder. Examples of solder resistive materials include nickel and nickel alloys. In other embodiments, the socket 330 is manufactured of an electrically conductive material such as brass or copper, and is then coated or plated with the material that is resistive to solder flow or has relatively low solderability.

In some embodiments, the core member 246 is manufactured entirely of an electrically conductive material that is easily solderable, and has better solderability properties than that of the socket 330. Such materials will be referred to herein as "solderable materials." Examples of solderable materials include gold and gold alloys. In other embodiments, the core member 246 is manufactured of an electrically conductive material such as brass or copper, and is then coated or plated with the material that easily solderable, and has better solderability properties than that of the terminal body. Examples of solderable materials which would be used as coating or plating materials are gold, gold alloys, tin, tin-lead alloys, and palladium-nickel alloys.

In some embodiments, the pin 260 and contact member 348 are manufactured entirely of a solderable materials. In other embodiments, the pin 260 and/or contact member 348 are manufactured of an electrically conductive material such as brass or copper, and are then coated or plated with a solderable material.

Although respective examples of solderable materials and solder resistive materials are listed above, other materials are applicable, and selection of material will depend on, at least, the type of solder employed.

Figure 3:
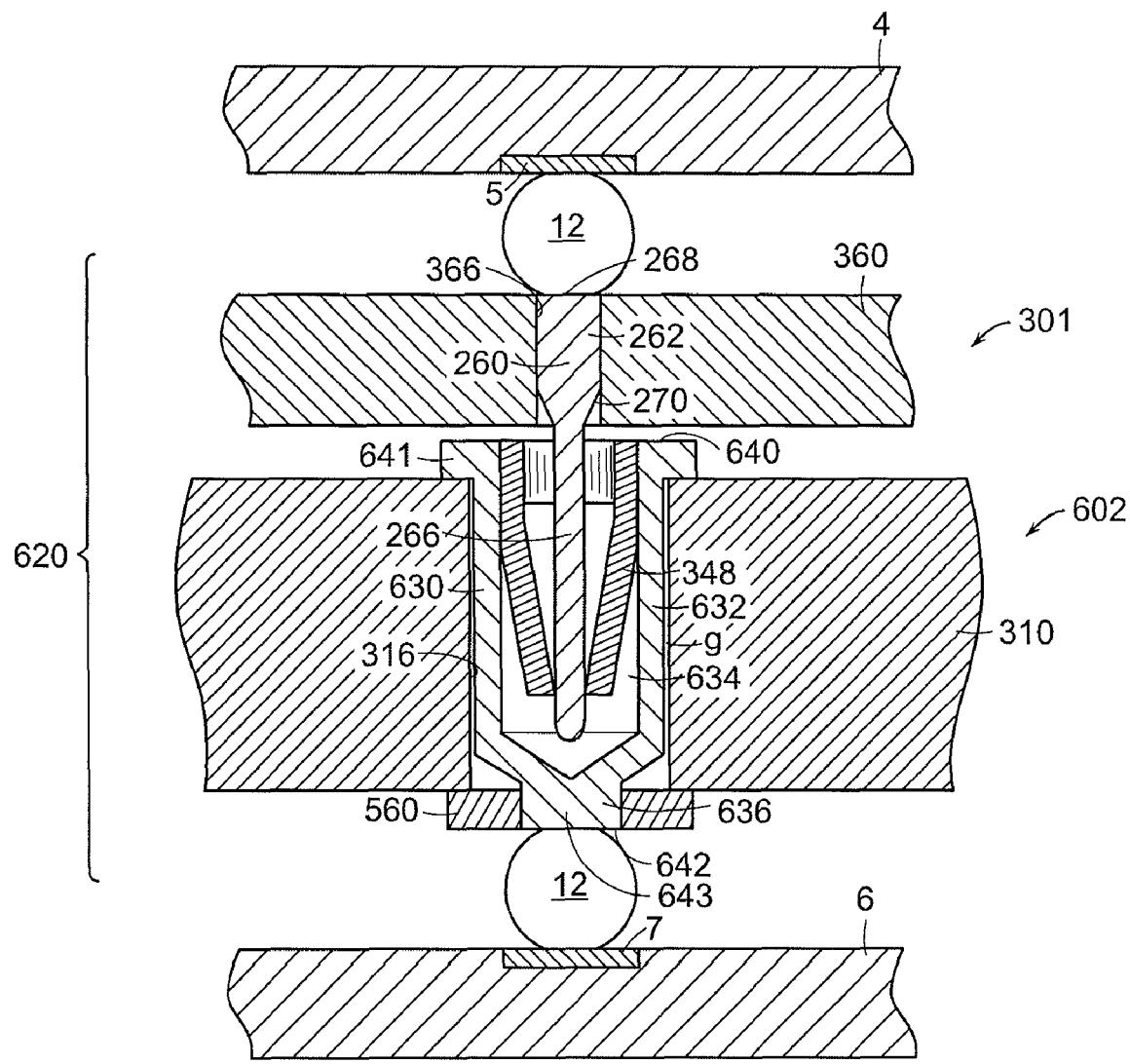
FIG. 3 is a partial side sectional view of another embodiment of an intercoupling component.

Referring now to FIG. 3, another embodiment of the socket converter assembly is shown. In this embodiment, the pin adaptor 301 of FIG. 2 is used with a socket adaptor 602 to provide a socket converter assembly 620. The socket adaptor 602 includes a socket 630 supported on the electrically insulative support member 310 as described in more detail below. As in the previous embodiment, in the socket converter assembly 620, each pin 260 cooperatively engages a corresponding socket 630 to provide an electrical connection between a surface mount pad 5 of BGA package 4 and a corresponding surface mount pad 7 of printed circuit board 6.

The socket 630 includes a socket base 636 having an end 642 configured to receive a solder ball 12, and a socket body 632 extending integrally from the socket base 636. The socket body 632 includes a socket cavity 634 opening at an end 640 of the socket body 632 opposed to the base end 642, and a resilient contact member 348 is fixed within the cavity 634 so as to form an electrical connection with the socket body 632 along mutually contacting surfaces. In use, the stem 266 of the pin 260 is received within, and forms an electrical connection with, the resilient contact member 348.

The first end 640 of the socket body is provided with a widened portion 641 having an outer dimension (e.g. diameter) that is greater than that of the socket body 632 and the hole 316. The second end 642 of socket 630 includes a narrowed portion 643 having a smaller cross-sectional dimension (e.g. diameter) than the socket body 632. An annular ring 560 is fitted on the periphery of the narrowed portion 643, and has an outer dimension (e.g. diameter) greater than that of the hole 316. The annular ring 560 cooperates with widened portion 641 of the socket body 632 to maintain the socket 630 within the hole 316 and to substantially prevent vertical movement of the socket 630 relative to support member 310. This configuration permits the socket 630 to have smaller cross-sectional dimensions that that of the hole 316 to an extent that a gap g exists between the socket 630 and the hole 316, a feature that reduces stress within the support member 310, and in turn can prevent warping of the socket adaptor 602.

Annular ring 560 encircles the narrowed portion 643. In addition, the narrowed portion 643 is dimensioned to be fitted within the inner diameter of the annular ring 560 so that fluid flow is prevented between the narrowed portion 643 and the inner diameter surface of the annular ring 560. In some embodiments, the socket 630, including the narrowed portion 643, is formed of, coated, or plated with an electrically conductive, solderable material, and the annular ring 560 is formed of a solder-resistive material. By selection of materials in this way, solder is permitted to flow and connect to the exposed end face 642 of the narrowed portion 643, but is substantially prevented from flowing along the inner diameter surfaces of the annular ring 560.

Figure 4:
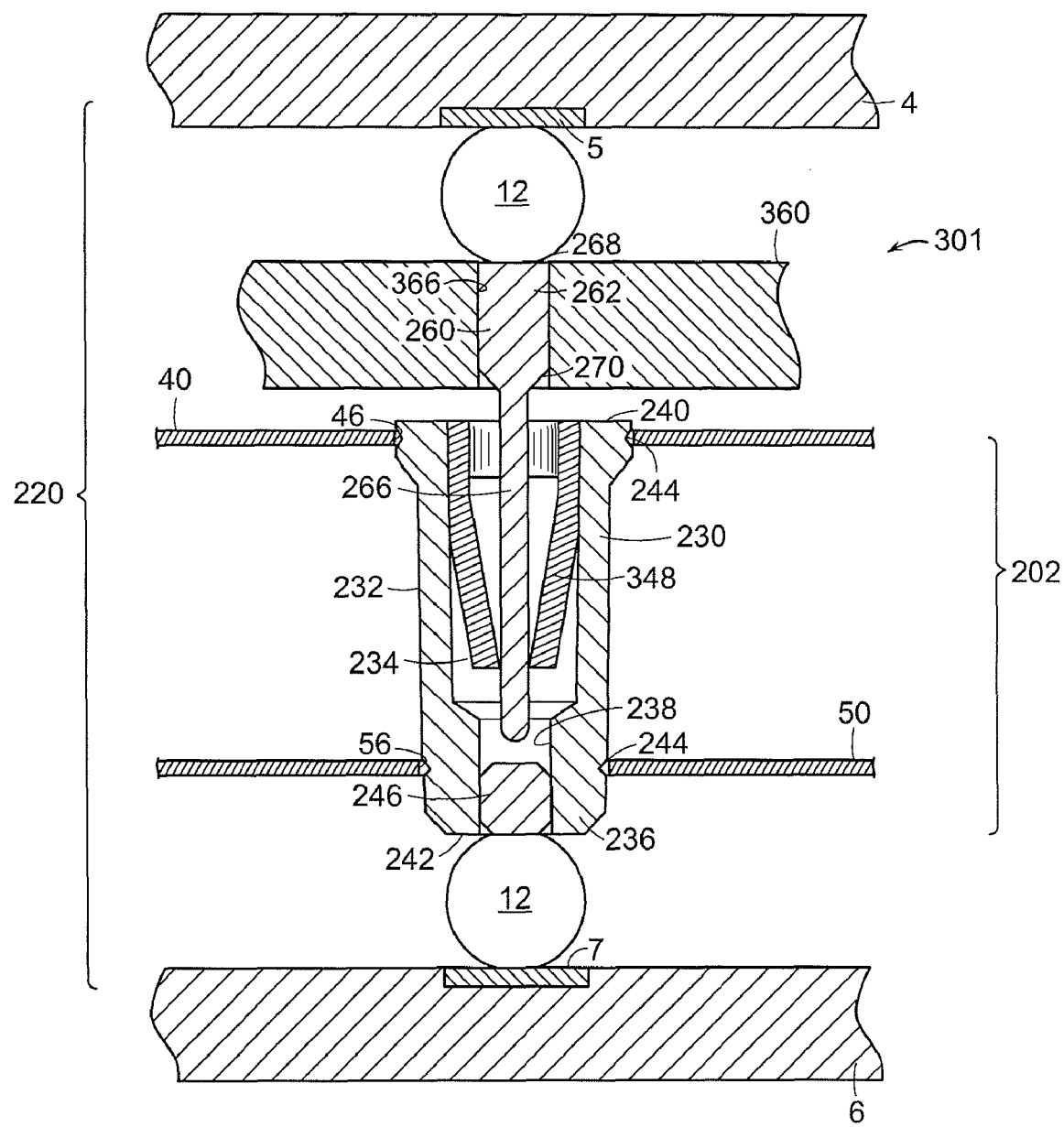
FIG. 4 is a partial side sectional view of another embodiment of an intercoupling component.

Referring now to FIG. 4, another embodiment of the intercoupling device is shown. In this embodiment, the pin adaptor 301 of FIG. 2 is used with a socket adaptor 202 to provide a socket converter assembly 220. The socket adaptor 202 includes a plurality of sockets 230 supported by support members 40, 50, in an arrangement which corresponds to the pattern of surface mount pads 5, 7 of the substrates 4, 6 to be interconnected. As in the previous embodiments, in the socket converter assembly 220, each pin 260 cooperatively engages a corresponding socket 230 to provide an electrical connection between a surface mount pad 5 of BGA package 4 and a corresponding surface mount pad 7 of printed circuit board 6.

The support members 40, 50 include an array of through holes 46, 56 each dimensioned to receive a socket 230 and arranged in the pattern described above. The support members 40, 50 are formed of a thin sheet (e.g. 5-7 mils) of insulative material. In some embodiments, the sheet may be somewhat flexible as embodied by a polyamide film. The polyamide film may be, for example, a Kapton® sheet (Kapton is a registered trademark of E.I. DuPont de Nemours & Co., Wilmington, Del.). In other embodiments, the sheet may be sufficiently rigid to retain a planar configuration when supported in a cantilevered manner, as embodied by a molded plastic sheet of FR4 printed circuit board material.

The lower end of the socket 230 includes a socket base 236 configured to receive a solder ball 12, and a socket body 232 extends from the socket base 236. The socket body 232 includes a socket cavity 234 opening at an upper end 240 of the socket body 232 opposed to the base end 242, and a resilient contact member 348 is fixed within the cavity 234 so as to form an electrical connection with the socket body 232 along mutually contacting surfaces. In use, the stem 266 of the pin 260 is received within, and forms an electrical connection with, the resilient contact member 348.

Circumferential grooves 244, provided about the periphery of each of the base end 236 and upper end 240, cooperatively engage the edge portions of the insulative support members 40, 50 at each respective hole 46, 56. That is, holes 46, 56 of the insulative support members 40, 50 are sized and shaped to correspond to the size and shape of the grooves 244 such that portions of the insulative support members reside within circumferential grooves 244. As a result, the axial position of the insulative support members 40, 50 relative to the socket 230 is easily maintained.

An axial hole 238 is provided at, and extends axially inward from, the end 242 of the socket base 236, and a core member 246 is disposed within the axial hole 238.

The core member 246 is sized and shaped to obstruct the axial hole 238, and forms an electrical connection with the socket base 236 along mutually contacting surfaces. As in the previous embodiment, the pin 260, the socket 230, and the core member 246 are each formed of electrically conductive materials. In socket converter assembly 220, solder is prevented from flowing along peripheral sides of the socket base 236 during solder reflow by selective use of materials in manufacturing the socket 230. In particular, the socket 230 is formed of, coated, or plated with a material that is resistive to solder flow or has relatively low solderability. In addition, the core member 246 is formed of, coated, or plated with material that has relatively high solderability in that it promotes solder flow, forms a good electrical contact and bonds well with a solder ball. As a result, during use when a solder ball 12, positioned adjacent to an end face 242 of the socket 230 is heated to cause the solder to flow, the solder does not flow along a peripheral side of the socket base 236 due to the due to the chemical response of the solder to the materials of these members, and is generally maintained in the vicinity of the core member 246.

Figure 5:
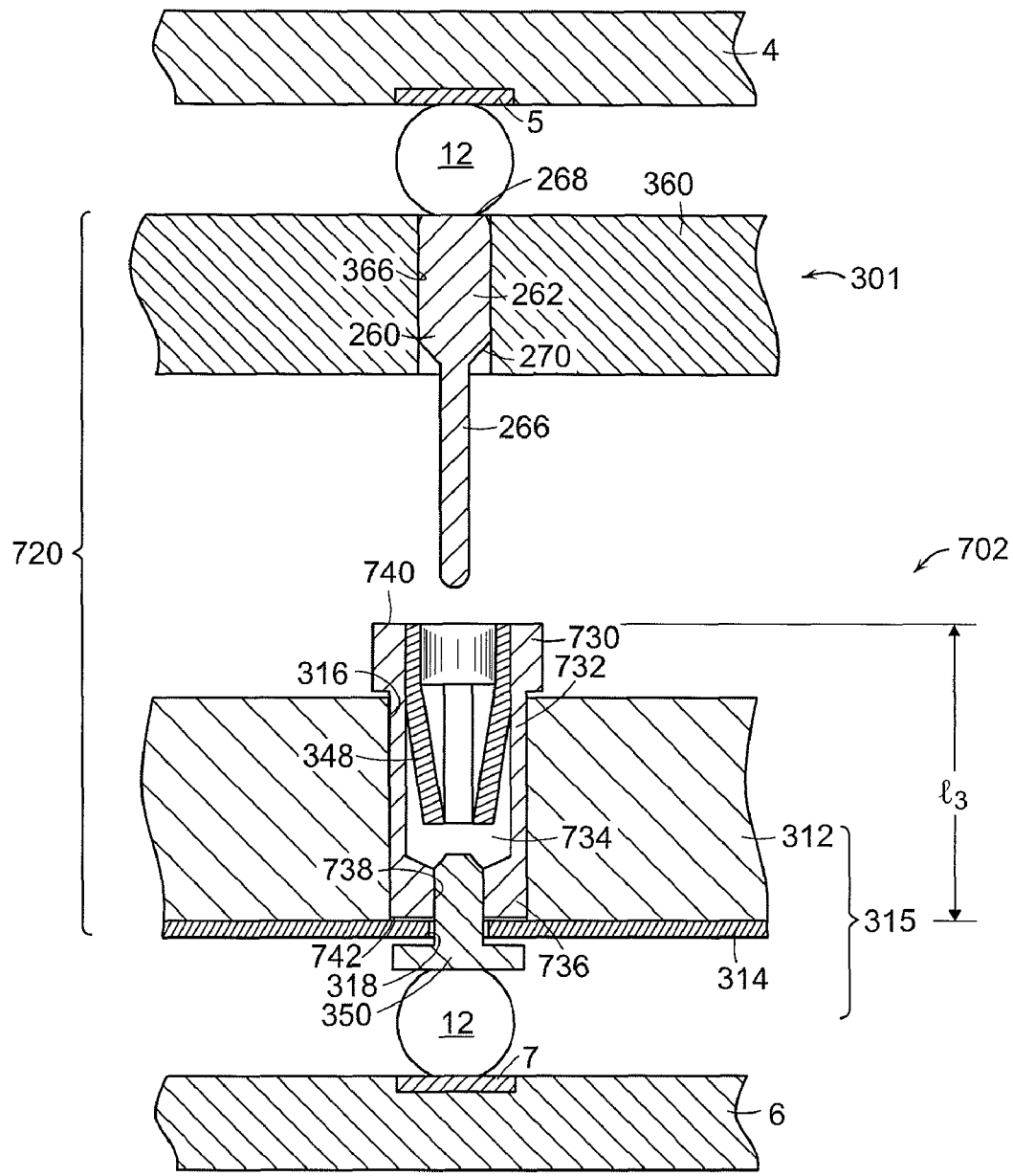
FIG. 5 is a partial side sectional view of another embodiment of an intercoupling component.

Referring now to FIG. 5, another embodiment of the intercoupling device is shown. In this embodiment, the pin adaptor 301 of FIG. 2 is used with a socket adaptor 702 to provide a socket converter assembly 720. The socket adaptor 702 includes a plurality of sockets 730 supported by a support member 315 in an arrangement which corresponds to the pattern of surface mount pads 5, 7 of the substrates 4, 6 to be interconnected. As in the previous embodiments, in the socket converter assembly 720, each pin 260 cooperatively engages a corresponding socket 730 to provide an electrical connection between a surface mount pad 5 of BGA package 4 and a corresponding surface mount pad 7 of printed circuit board 6.

Figure 6:
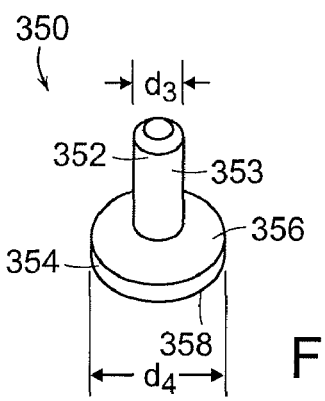
FIG. 6 is a perspective view of the core member of the terminal of FIG. 5.

The support member 315 is formed of an electrically insulative material. In some embodiments, support member 315 is of single-piece construction. In the illustrated embodiment, support member 315 is of two-piece construction and includes a base layer 312, and an outer layer 314 pressed onto an outward-facing surface of the base layer 312. The base layer 312 and outer layer 314 may be formed of the same insulative material, or formed of different insulative materials. The outer layer 314 is thin relative to the base layer 312. For example, the base layer 312 may be in the range of 5 to 20 times the thickness of the outer layer 314. The support member 315 is provided having an overall thickness that is about or slightly less than the axial length l3 of the socket 730. Each layer 312, 314 of the support member 315 includes a respective array of through holes 316, 318 arranged in the pattern described above. The through holes 316 of base layer 312 are dimensioned to correspond to the shape and size of the socket 730, and the through holes 318 of the outer layer 314 are dimensioned to correspond to the shape and size of a shank portion 352 of the socket core 350 (FIG. 6, described below).

The socket 730 includes a socket base 736, and a socket body 732 extending from the socket base 736. The socket body 732 includes a socket cavity 734 opening at the first end 740 of the socket body 732. A resilient contact member 348 is fixed within the cavity 734 so as to form an electrical connection with the socket base 736 along mutually contacting surfaces. In use, the stem 266 of the pin 260 is received within, and forms an electrical connection with, the resilient contact member 348.

A socket axial hole 738 is provided at, and extends axially inward from, the end 742 of the socket base 736. A shaped socket core 350 is disposed within the socket axial hole 738. As seen in FIG. 6, the shaped core member 350 includes a shank portion 352 sized to be received within the socket axial hole 738, and a head portion 354 connected to an end of the shank portion 352. In some embodiments, the shank portion 352 is fitted within the socket axial hole 738. When the socket 730 is received within the support member 315, the head portion 354 is disposed outside the through hole 318 of the outer layer 314. The shank portion 352 of the shaped core member 350 has a shank cross-sectional dimension d3 (e.g. diameter), the head portion 354 has a head cross-sectional dimension d4 (e.g. diameter), and the head cross-sectional dimension d4 is greater than the shank cross-sectional dimension d3. As shown in FIG. 5, when the shank portion 352 is received within the socket axial hole 738, the head portion 354 is disposed outside the axial hole 738, and extends in a plane that is perpendicular to an axial direction of the shank portion 352 so that a side 356 of the head portion 354 is spaced apart from and faces toward the end 742 of the socket base 736. The outer layer 314 of the support member 315 is interposed between the side 356 of the head portion 354 and the end 742 of the socket base 736.

The core member 350 is electrically conductive, and the shank portion 352 is sized and shaped to obstruct the socket axial hole 738 and form an electrical connection with the socket base 736 along mutually contacting surfaces. As in previous embodiments, the socket 730 and the core member 350 are each formed of electrically conductive materials. In socket 730, solder is prevented from flowing along a peripheral side of the socket base 736 during solder reflow by selective use of materials. In particular, the socket 730, including the socket base 736, is formed of, coated, or plated with a material that is resistive to solder flow or has relatively low solderability. In addition, the core member 350 is formed of, coated, or plated with material that has relatively high solderability in that it promotes solder flow, forms a good electrical contact and bonds well with a solder ball. As a result, during use when a solder ball 12 positioned adjacent to a lower side 358 of the core member 350 is heated to cause the solder to flow, the solder does not flow along a peripheral side of the socket base 736 due to the due to the chemical response of the solder to the materials of these members, and is generally maintained in the vicinity of the head portion 354 of the core member 350. In some embodiments, solder retention in the vicinity of the head portion 354 may be enhanced by use of a solder resist coating an outward-facing surface of the outer layer 314 of the support member 315.

Referring now to FIG. 7, another embodiment of the intercoupling device is shown. In this embodiment, the pin adaptor 301 of FIG. 2 is used with a socket adaptor 502 to provide a socket converter assembly 520. The socket adaptor 502 includes a plurality of sockets 530 supported by a support member 510 in an arrangement which corresponds to the pattern of surface mount pads 5, 7 of the substrates 4, 6 to be interconnected. As in the previous embodiments, in the socket converter assembly 520, each pin 260 cooperatively engages a corresponding socket 530 to provide an electrical connection between a surface mount pad 5 of BGA package 4 and a corresponding surface mount pad 7 of printed circuit board 6.

The socket 530 is supported on one of an array of holes 516 formed in an insulative support member 510, and includes a socket base 536, and a socket body 532 extending from the socket base 536. The socket body 532 includes a socket cavity 534 opening at the first end 540 of the socket body 532. A resilient contact member 348 is fixed within the cavity 534 so as to form an electrical connection with the socket base 536 along mutually contacting surfaces. In use, the stem 266 of the pin 260 is received within, and forms an electrical connection with, the resilient contact member 348.

The first end 540 of the socket body 532 is provided with a widened portion 541 having an outer dimension (e.g. diameter) that is greater than that of the socket body 532 and the hole 516. The second end 542 of socket 530 includes a narrowed portion 543 having a smaller cross-sectional dimension (e.g. diameter) than the socket body 532. An annular ring 560 is fitted on the narrowed portion 543, and has an outer dimension (e.g. diameter) greater than that of the hole 516. The annular ring 560 cooperates with widened portion 541 of the socket body 532 to prevent vertical movement of the socket 530 relative to support member 510. This configuration permits the socket 530 to have smaller cross-sectional dimensions than that of the hole 516 to an extent that a gap g exists between the socket 530 and the hole 516, a feature that reduces stress within the support member 510, and in turn can prevent warping of the intercoupling device 520.

The narrowed portion 543 terminates at a plug 550. In some embodiments, the plug 550 is formed separately from the socket 530, and is fixed to the narrowed portion 543 by conventional means in such a way as to provide an electrically conductive path therethrough. For example, in some embodiments, an interference fit between the annular ring 560 and the plug 550, and between the annular ring 560 and the narrowed portion 543 retains the plug 550 in electrical contact with the narrowed portion 543.

The annular ring 560 encircles both the narrowed portion 543 and plug 550. In addition, the narrowed portion 543 and plug 550 are dimensioned to be fitted within inner diameter of the annular ring 560 so that fluid flow is prevented between either of the narrowed portion 543 or plug 550, and the inner surface of the annular ring 560. In some embodiments, the socket 530 including the narrowed portion 543 are formed of an electrically conductive material such as brass, the plug 550 is formed of a solderable material, and the annular ring 560 is formed of, or plated with a solder-resistive material. By selection of materials in this way, solder is permitted to flow and connect to the plug 550, but is substantially prevented from flowing along the surfaces of the annular ring 560.

Referring now to FIG. 8, another embodiment of the intercoupling device is shown. In this embodiment, the pin adaptor 301 of FIG. 2 is used with a socket adaptor 402 to provide a socket converter assembly 420. The socket adaptor 402 includes a plurality of sockets 430 supported by support members 40, 50 (described above with reference to FIG. 4) in an arrangement which corresponds to the pattern of surface mount pads 5, 7 of the substrates 4, 6 to be interconnected. As in the previous embodiments, in the socket converter assembly 420, each pin 260 cooperatively engages a corresponding socket 430 to provide an electrical connection between a surface mount pad 5 of BGA package 4 and a corresponding surface mount pad 7 of printed circuit board 6.

The socket 430 includes a socket base 436, and a socket body 432 extending from the socket base 436. The first, upper end 440 of socket 430 is supported in a corresponding hole 46 of the support member 40 and the second, lower end 442 of socket 430 is supported in a corresponding hole 56 of the support member 50.

A circumferential groove 444 is provided about the periphery of first end 440, which cooperatively engages the edge portion of the insulative support members 40 at each respective hole 46. That is, holes 46 of the insulative support members 40 are sized and shaped to correspond to the size and shape of the grooves 444 such that portions of the insulative support members reside within circumferential grooves 444.

The socket body 432 includes a socket cavity 434 opening at the first end 440 of the socket body 432. A resilient contact member 348 is fixed within the cavity 434 so as to form an electrical connection with the socket base 436 along mutually contacting surfaces. In use, the stem 266 of the pin 260 is received within, and forms an electrical connection with, the resilient contact member 348.

The second end 442 of socket 430 includes a narrowed portion 443 having a smaller cross-sectional dimension (e.g. diameter) than the socket body 432. The holes 56 of the insulative support member 50 are sized and shaped to substantially correspond to the size and shape of the narrowed portion 443, and in use, the narrowed portion 443 is received in a corresponding hole 56. The narrowed portion 443 terminates at a plug 450.

An annular ring 460 is fitted about the narrowed portion 443 and plug 450, and has an outer dimension (e.g. diameter) greater than that of the hole 56. The annular ring 460 prevents vertical movement of the socket 430 relative to support member 50. This configuration permits the narrowed portion 443 of socket 430 to have a smaller cross-sectional dimension that that of the hole 56 to an extent that a gap exists between the narrowed portion 443 and the hole 56, a feature that reduces stress within the support member 50, and in turn can prevent warping of the intercoupling device.

The annular ring 460 encircles both the narrowed portion 443 and plug 450. In addition, the narrowed portion 443 and plug 450 are dimensioned to be fitted within the annular ring 460 so that fluid flow is prevented between either of the narrowed portion 443 or plug 450, and the inner surface of the annular ring 460. In some embodiments, the socket 430, including the narrowed portion 443, is formed of an electrically conductive material such as brass, the plug 450 is formed of, coated, or plated with a solderable material, and the annular ring 460 is formed of a solder-resistive material. By selection of materials in this way, solder is permitted to flow and connect to the plug 450, but is substantially prevented from flowing along the surfaces of the annular ring 460 or the socket body 432.

Figure 9:
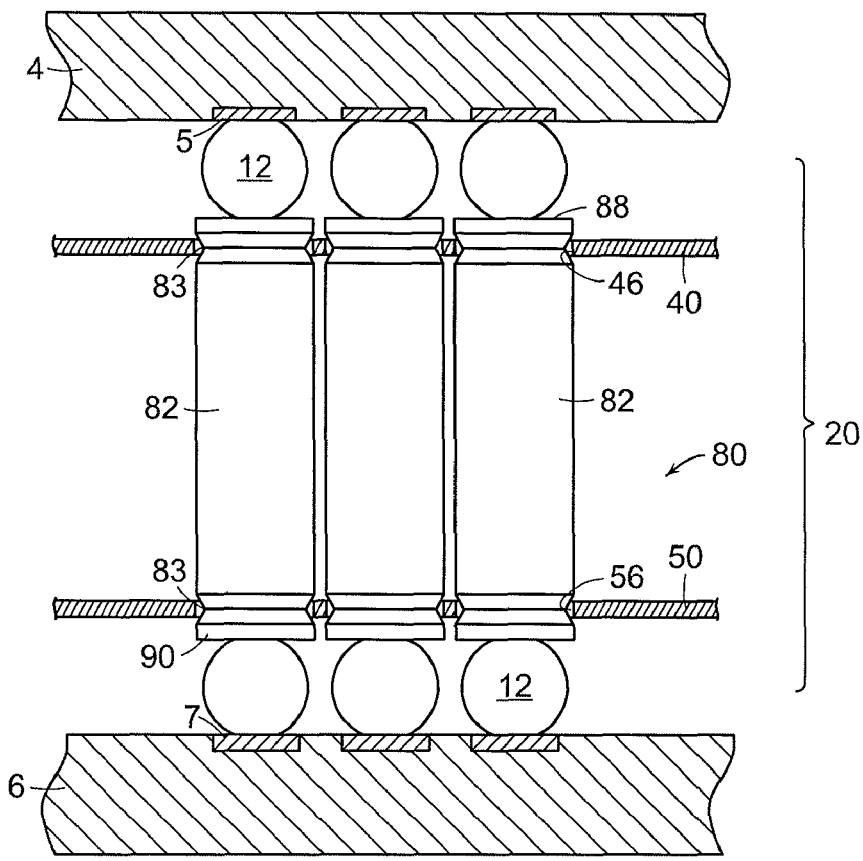
FIG. 9 is a side view of another embodiment of an intercoupling component.

Referring now to FIG. 9, an intercoupling device 20, used to provide an electrical connection between electrical contacts (e.g. surface mount pads 5) of a first substrate (e.g. BGA package 4) and corresponding electrical contacts (e.g. surface mount pads 7) of a second substrate (e.g. printed circuit board 6), will now be described. The intercoupling device 20 includes a plurality of electrically conductive, single-piece terminals 80, a support member 40 which supports a first end (illustrated here as the upper end) 88 of each terminal 80, and a support member 50 which supports a second end (illustrated here as the lower end) 90 of each terminal 80. The terminals 80 are supported by the support members 40, 50 in an arrangement which corresponds to the pattern of surface mount pads 5, 7 of the substrates 4, 6 to be interconnected.

The support members 40, 50 are substantially similar to those described above with respect to FIG. 4, and their description is not repeated here.

Each terminal 80 includes an electrically conductive terminal body 82. In the embodiment illustrated in FIGS. 8-10, the terminal body 82 is an elongate member. For example, the axial length l1 of the terminal body 82 is at least twice the cross-sectional dimension (e.g. diameter d1) of the terminal body 82. In some embodiments, the terminal body 82 is generally cylindrical, although the cross-sectional shape of the terminal body 82 is not limited to a circular shape. Each of the first and second ends 88, 90 is configured to receive a solder ball 12.

Circumferential grooves 83 may be provided adjacent to each of the first and second ends 88, 90, which cooperatively engage the edge portions of the insulative support members 40, 50 at each respective hole 46, 56. That is, holes 46, 56 of the insulative support members 40, 50 are sized and shaped to correspond to the size and shape of the groove 83, such that portions of the insulative support members reside within circumferential grooves 83. As a result, the axial position of the insulative support members 40, 50 relative to the terminal body 82 is easily maintained.

Figures 10, 11, 12, 13:
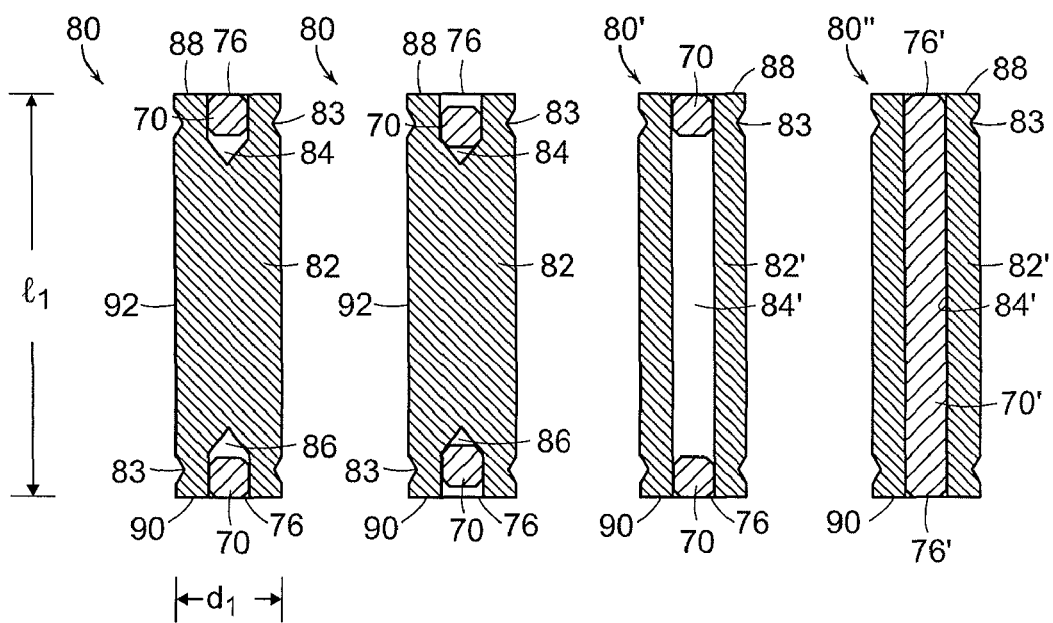
FIG. 10 is a side sectional view of a terminal of the intercoupling component of FIG. 9.
FIG. 11 is a side sectional view of another embodiment of a terminal of the intercoupling component of FIG. 9.
FIG. 12 is a side sectional view of another embodiment of a terminal of the intercoupling component of FIG. 9.
FIG. 13 is a side sectional view of another embodiment of a terminal of the intercoupling component of FIG. 9.

As seen in FIG. 10, a first axial hole 84 is provided at, and extends axially inward from, the first end 88 of the terminal body 82. Similarly, a second axial hole 86 is provided at, and extends axially inward from, the second end 90 of the terminal body 82. A core member 70 is disposed within each of the first axial hole 84 and second axial hole 86.

The core members 70 are electrically conductive and are sized and shaped to obstruct the respective axial hole 84, 86, whereby fluid flow between the core member 70 and the inner surface of the respective axial hole 84, 86 is prevented. The core members 70 may be fixed within the respective axial hole 84, 86 and form an electrical connection with the terminal body 82 along mutually contacting surfaces. The core members 70 may be positioned within the respective axial hole 84, 86 so that an end face 76 of the core member 70 lies flush with the corresponding end face of the terminal body 82 (FIGS. 10, 12).

Alternatively, the core members 70 may be positioned within the respective axial hole 84, 86 so that an end face 76 of the core member 70 is spaced slightly inward relative to an end face of the terminal body 82, forming a shallow depression at the location of the core member 70 (FIG. 11). The depression can be useful in positioning and retaining the solder ball 12 relative to the terminal 80.

As discussed above, both the terminal body 82 and core members 70 are formed of electrically conductive materials. In terminal 80, solder is prevented from flowing along a peripheral side 92 of the terminal body 82 during solder reflow by selective use of materials in manufacturing the terminal 80. In particular, terminal body 82 is formed of, coated, or plated with a material that is resistive to solder flow or has relatively low solderability. In addition, core members 70 are formed of, coated, or plated with material that has relatively high solderability in that it promotes solder flow, forms a good electrical contact and bonds well with a solder ball. As a result, during use when a solder ball 12, positioned adjacent to an end face of the terminal 80, is heated to cause the solder to flow, the solder does not flow along a peripheral side 92 of the terminal body 82 due to the chemical response of the solder to the materials of the terminal body 82, and is generally maintained in the vicinity of the core members 70.

In some embodiments, the terminal body 82 is manufactured entirely of an electrically conductive material that is resistive to solder flow or has relatively low solderability as compared to the material used to manufacture the core members 70. In other embodiments, the terminal body 82 is manufactured of an electrically conductive material such as brass or copper, and is then coated or plated with the material that is resistive to solder flow or has relatively low solderability.

In some embodiments, the core member 70 is manufactured entirely of an electrically conductive material that is easily solderable, and has better solderability properties than that of the terminal body 82. In other embodiments, the core member 70 is manufactured of an electrically conductive material such as brass or copper, and is then coated or plated with the material that easily solderable, and has better solderability properties than that of the terminal body 82.

Referring now to FIG. 12, in some embodiments, a terminal 80' may include a single axial through hole 84', and core members 70 are provided within the through hole 84' such that a first core member 70 is disposed adjacent to the first end 88 of the terminal body 82', and a second core member 70 is disposed adjacent to the second end 90 of the terminal body 82'. As in earlier embodiments, the core members 70 are electrically conductive and are sized and shaped to obstruct the respective axial hole 84'. In addition, the core members 70 are formed of, coated or plated with a solderable material, and the terminal body 82' is formed of, coated or plated a solder resistive material.

Referring now to FIG. 13, in some embodiments, a terminal 80" may include a single axial through hole 84', and a single, elongate core member 70' is provided within the through hole 84' such that the elongate core member 70' extends from the first end 88 of the terminal body 82' to the second end 90 of the terminal body 82'. As in earlier embodiments, the elongate core member 70' is electrically conductive and is sized and shaped to obstruct the respective axial hole 84. In addition, the core member 70' is formed of, coated or plated with a solderable material, and the terminal body 82' is formed of, coated or plated with a solder resistive material.

Referring now to FIGS. 14-16, another embodiment of the intercoupling device is shown. Intercoupling device 120 is used to provide an electrical connection between surface mount pads of BGA package 4 and corresponding surface mount pads of printed circuit board 6. The intercoupling device 120 includes a plurality of electrically conductive terminals 180 supported by a single support member 40, in an arrangement which corresponds to the pattern of surface mount pads 5, 7 of the substrates 4, 6 to be interconnected.

Each terminal 180 includes an electrically conductive terminal body 182. The terminal body 182 is a member in which the axial length l2 of the terminal body 182 is less than the cross-sectional dimension (e.g. diameter d2) of the terminal body 182, whereby the terminal body 182 is a substantially disk-shaped member. In some embodiments, the terminal body 182 is generally cylindrical, although the cross-sectional shape of the terminal body 182 is not limited to a circular shape. The terminal body 182 has a first end 188, and a second end 190 opposed to the first end 188. Each of the first and second ends 188, 190 is configured to receive a solder ball 12.

As seen in FIG. 15, an axial through hole 184 is provided in the terminal body 182, and a core member 170 is provided within the through hole 184 such that the core member 170 extends from the first end 188 of the terminal body 182 to the second end 190 of the terminal body 182. As in earlier embodiments, the core member 170 is electrically conductive and is sized and shaped to obstruct the axial hole 184, forming an electrical connection with the terminal body 182 along mutually contacting surfaces. In addition, the core member 170 is formed of, coated, or plated with a solderable material, and the terminal body 182 is formed of, coated or plated with a solder resistive material.

The core member 170 may be positioned within the axial hole 184 so that one or both end faces 176 of the core member 170 lie flush with the corresponding end face of the terminal body 182 (FIG. 15). Alternatively, the core member 170 may be positioned within the axial hole 184 so that the end faces 176 of the core member 170 are spaced slightly inward relative to an end face of the terminal body 182, forming a shallow depression at the location of the core member 170 (FIG. 16).

A method of forming the electrical terminals 80, 180 will now be described.

The terminals 80, 180 are each formed individually. In addition, the terminal body 82, 182 is formed separately from the core members 70, 170. In some embodiments, the terminal body 82, 182 is formed using a screw machining process, including formation of the axial hole 84, 86, 184 in one or both ends. The core members 70, 170 may be formed using a screw machining process, or alternatively may be formed using other processes including stamping or riveting.

In some embodiments, the terminal body 82, 182 and core members 70, 170 are formed of an electrically conductive material such as brass. An outer surface of the terminal body 82, 182 is then plated or coated with a solder resistive material, and the outer surface of the core members 70, 170 is plated or coated with a solderable material.

Then, the core members 70, 170 are assembled within the corresponding axial holes of the terminal body 82, 182 so that the axial hole is obstructed.

In the converter assembly 220, 320, 420, 520, 620, 720 (FIGS. 2-5 and 7-8) which employs an assembly of a pin and a socket to provide an electrical terminal, the socket 230, 330, 430, 530, 630, 730 is formed separately from its respective core (plug) member 246, 350, 450, 550 and/or annular ring 460, 560, as well as from the pin 260. The socket 230, 330, 430, 530, 630, 730 and annular ring 460, 560 (if required) are then plated or coated with a solder resistive material. The pin 260 and core (plug) member 246, 350, 450, 550 are plated or coated with a solderable material.

The core (plug) members 246, 350, 450, 550 and annular ring 460, 560 (if required) are then assembled with the corresponding socket body 230, 330, 430, 530, 630, 730 as described above.

By this procedure, at least an outer surface of the pin 260 and core (plug) member 70, 170, 246, 350, 450, 550 includes a first material and at least an outer surface of the body 82, 182, 232, 332, 432, 532, 632 and/or annular ring 460, 560 includes a second material, the first material having greater solderability (being more solderable) than the second material.

Recent regulatory efforts to limit certain hazardous substances in some geographic areas and/or in some industries, such as the Restriction of Hazardous Substances in Electrical and Electronic Equipment (RoHS), have resulted in inconsistencies in the products that are manufactured, such that some electronic components, including IC packages and/or printed circuit boards, are compliant with regulations and some are not. Thus, it can be advantageous to provide an intercoupling device which permits, for example, a lead-free component to be assembled to a lead-containing component. A method of connecting a lead-free substrate (e.g. BGA package 4) using lead-free solder balls 12a, to electrical connections on a second, lead-containing substrate (e.g. printed circuit board 6) using lead-containing solder balls 12b is accomplished using the intercoupling devices described above. The method will be described herein with reference to FIGS. 17-20 using the intercoupling device 120 as an example.

Figure 17:
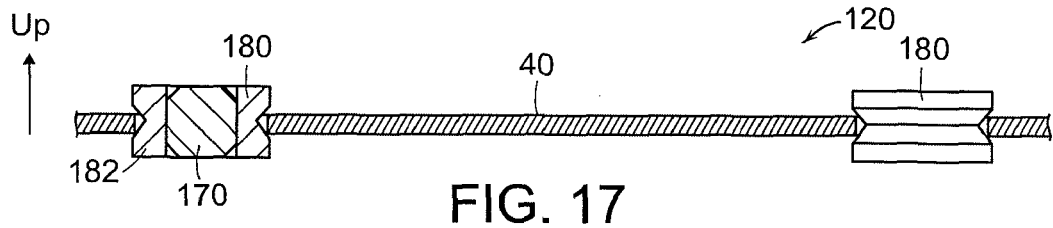
FIGS. 17-20 are partial side-sectional views of the intercoupling component of FIG. 14 illustrating the method of connecting a BGA package using lead-free solder balls to electrical connections on a printed circuit board using lead-containing solder balls.

The connecting method includes the following method steps:

The intercoupling device 120 is provided which includes a plurality of individual electrical terminals 180 supported on an insulative sheet member 40, the terminals arranged in a pattern corresponding to that of the electrical connections of the substrates 4, 6 to be connected. In FIG. 17, only two terminals 180 are shown for simplicity of illustration. However, it is understood that the number and arrangement of terminals 180 may correspond to the number and arrangement of electrical contacts of one or both substrates 4, 6.

Figure 18:
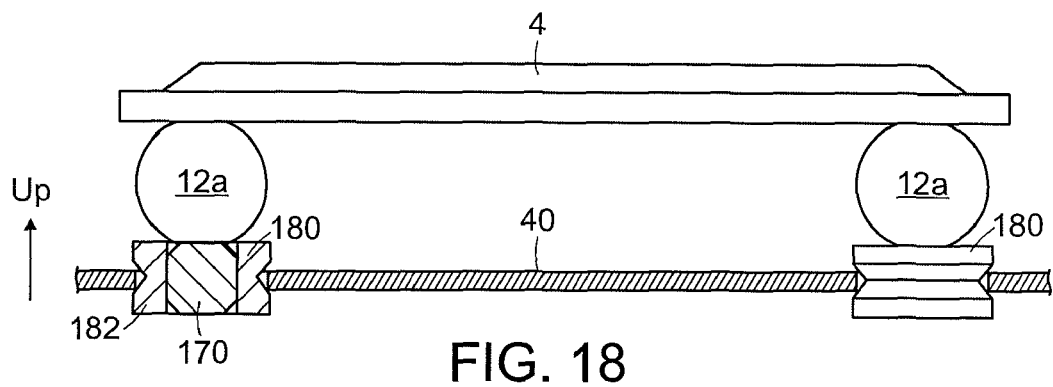

The first substrate (BGA package 4) is arranged on an upward-facing surface of the intercoupling device 120 such that each lead-free solder ball 12a of the ball grid array contacts a corresponding terminal 180 (FIG. 18). The lead free solder balls 12a are formed, for example, of a tin-silver-copper alloy.

The intercoupling device 120 and BGA package 4 are placed in an environment having a temperature within a first range of temperatures. The first range of temperatures will depend on the specific material(s) used to form solder ball 12a, and is selected to be appropriate for causing reflow of the solder ball 12a described above and for forming an electrical connection between each solder ball 12a of the ball grid array and the corresponding terminal 180, while being sufficiently low to avoid causing damage to the BGA package 4. For a lead-free solder ball 12a formed of a tin-silver-copper alloy, the corresponding first temperature range is about 235-245 degrees Celsius.

Figure 19:
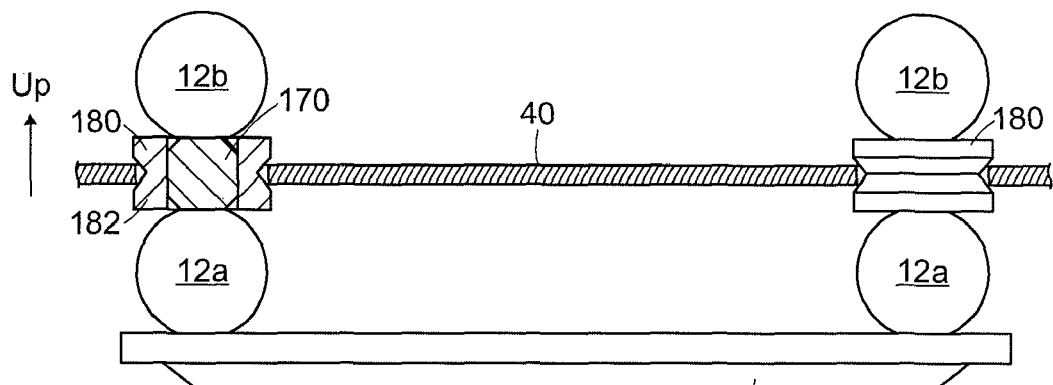

The intercoupling device 120 is then inverted so that the BGA package 4 resides below the device (FIG. 19).

Lead-containing solder balls 12b are provided on upward facing surfaces of one or more of the terminals 180. The lead-containing solder balls 12b may be formed of a tin-lead alloy.

With the lead-containing solder balls 12b provided on the upward facing surfaces of the one or more terminals 180, the intercoupling device 120, BGA package 4, and solder balls 12b are then heated in an environment having a temperature within a second range of temperatures. The second range of temperatures will depend on the specific materials used to form the lead-containing solder balls 12b, and is selected to be sufficient to permit the lead-containing solder balls 12b to bond to corresponding terminals 180, but insufficient to cause reflow of the lead-free solder balls 12a. For a lead-containing solder ball 12b formed of a tin-lead alloy, the corresponding second range of temperatures is about 200-210 degrees Celsius. In this step, duration of heating is sufficiently short to prevent complete reflow of the lead-containing solder balls 12b, and is sufficiently long to permit an electrical connection to be established between each lead-containing solder ball 12b and the corresponding terminal 180.

Figure 20:
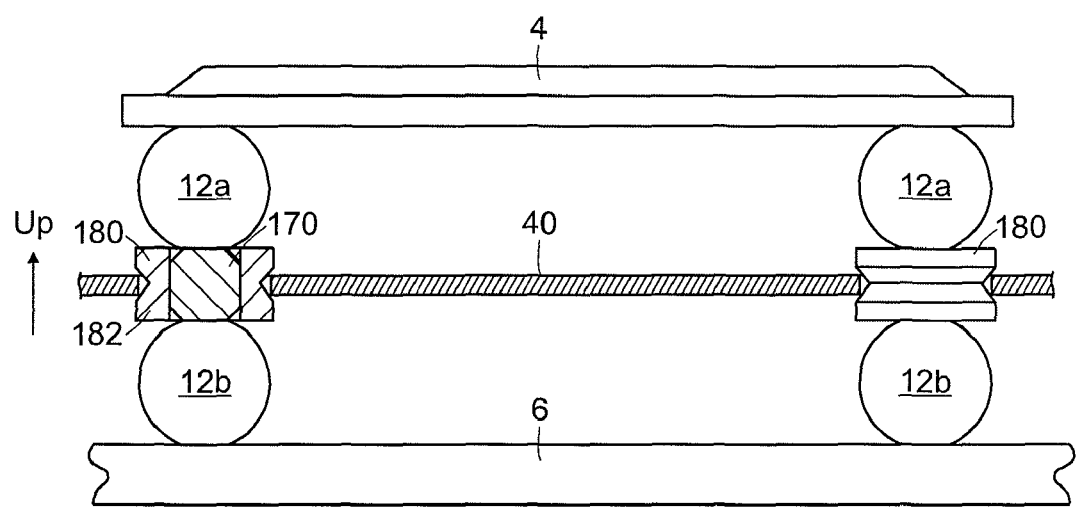

The intercoupling device 120 is then inverted so that the BGA package 4 resides above the device (FIG. 20).

The intercoupling device is arranged on an upper surface of the printed circuit board 6 such that each lead-containing solder ball 12b contacts an electrical contact element of the printed circuit board 6.

The BGA package 4, the intercoupling device 120, and the printed circuit board 6 are heated in an environment having a temperature within the second range of temperatures until an electrical connection is formed between each lead-containing solder ball 12b and the corresponding electrical contact elements of the printed circuit board 6.

Selected illustrative embodiments of the invention are described above in some detail. It should be understood that only structures considered necessary for clarifying the present invention have been described herein. Other conventional structures, and those of ancillary and auxiliary components of the system, are assumed to be known and understood by those skilled in the art.

Moreover, while working examples of the present invention have been described above, the present invention is not limited to the working examples described above, but various design alterations may be carried out without departing from the present invention as set forth in the claims.

For example, although the embodiments disclosed herein illustrate devices which intercouple a printed circuit board and a BGA package, it is understood that the devices can also be use to intercouple a first printed circuit board to a second printed circuit board, and/or a first integrated circuit package to a second integrated circuit package.

What is claimed is:

1. An apparatus comprising an electrical terminal assembly including:
an electrically conductive terminal body, the terminal body including
a first end and an axial hole extending inward from the first end, the first end configured to receive a first solder ball, and
a second end opposed to the first end, the second end configured to receive a second solder ball; and
an electrically conductive core member sized and shaped to obstruct the hole, the core member disposed within the hole such that the hole is obstructed, where being obstructed refers to full and complete blocking of the hole whereby fluid flow between the core member and an inner surface of the hole is prevented,
wherein at least an outer surface of the core member includes a first material and at least an outer surface of the body includes a second material, the first material having greater solderability than the second material.

2. The apparatus of claim 1, wherein the first material is one of gold, gold alloy, tin, tin-lead alloy, and palladium-nickel alloy.

3. The apparatus of claim 1, wherein the second material is one of nickel and nickel alloy.

4. The apparatus of claim 1, wherein the core member is fixed within the hole.

5. The apparatus of claim 1, wherein the core member comprises
a shank portion received within the axial hole, and
a head portion connected to the shank portion, the head portion disposed outside the axial hole and including a side which faces toward the first end.

6. The apparatus of claim 1, wherein the core member is an elongate cylindrical member comprising a first end and a second end, wherein
the first end is provided with a first diameter, and the second end is provided with a second diameter,
the second diameter is greater than the first diameter, and the first end is fitted within the axial hole.

7. The apparatus of claim 1, further comprising:
an insulating support member including an array of apertures, each aperture extending from a first surface of the insulating support member to an opposite second surface of the insulating support member, each aperture configured to receive an electrical terminal assembly; and
one or more electrical terminal assemblies disposed in respective apertures, the electrical terminal assemblies configured to provide electrical connections between connection regions of a first substrate and respective corresponding connection regions of a second substrate.

8. The apparatus of claim 7, wherein the first material is one of gold, gold alloy, tin, tin-lead alloy, and palladium-nickel alloy.

9. The apparatus of claim 7, wherein the second material is one of nickel and nickel alloy.

10. The apparatus of claim 7, wherein the core member is fixed within the through hole.

11. The apparatus of claim 7, wherein the insulative support member comprises a thin polyamide sheet.

12. The apparatus of claim 7, wherein the core member is positioned within the axial hole such that an end face of the core member is flush with respect to the first end of the body.

13. The apparatus of claim 7, wherein the core member comprises a shank portion received within the axial hole, and a head portion connected to the shank portion, the head portion disposed outside the axial hole and including a side which faces toward the first end.

14. The apparatus of claim 1, wherein the hole extends from the first end to the second end,
the core member is disposed within the hole adjacent to the first end, and
the terminal body further comprises a resilient contact member disposed within the hole adjacent to the second end.

15. The apparatus of claim 1, wherein at least a portion of the core member is shaped and dimensioned to correspond to the shape and dimensions of the axial hole.

16. The apparatus of claim 1 wherein the axial hole terminates within the terminal body, and the terminal body further comprises second axial hole extending inward from the second end, the second axial hole terminating within the terminal body, and the terminal assembly further comprises a second electrically conductive core member disposed within the second axial hole, the second core member sized and shaped to obstruct the second axial hole.

* * * * *